I

US008438329B2

(12) United States Patent  
Janzen

(10) Patent No.: US 8,438,329 B2
(45) Date of Patent: May 7, 2013

(54) SYSTEM AND METHOD FOR OPTIMIZING INTERCONNECTIONS OF COMPONENTS IN A MULTICHIP MEMORY MODULE

(75) Inventor: Jeffery W. Janzen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/986,947

(22) Filed: Jan. 7, 2011

(65) Prior Publication Data

US 2011/0103122 A1 May 5, 2011

Related U.S. Application Data

(63) Continuation of application No. 11/417,389, filed on May 3, 2006, now Pat. No. 7,870,329, which is a continuation of application No. 10/822,275, filed on Apr. 8, 2004, now Pat. No. 7,590,797.

(51) Int. Cl.
*G06F 12/00* (2006.01)
*G06F 13/00* (2006.01)

(52) U.S. Cl.
USPC ............... 711/105; 711/5; 711/115; 711/147; 711/154

(58) Field of Classification Search ............... 711/5, 105, 711/115, 147, 154
See application file for complete search history.

(56) References Cited

U.S. PATENT DOCUMENTS

| 3,777,154 A | 12/1973 | Lindsey | |
| 4,045,781 A | 8/1977 | Levy et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,443,845 A | 4/1984 | Hamilton et al. | 364/200 |
| 4,608,702 A | 8/1986 | Hirzel et al. | 375/110 |
| 4,633,437 A | 12/1986 | Mothersole et al. | 364/900 |

(Continued)

FOREIGN PATENT DOCUMENTS

| EP | 0849685 A2 | 6/1998 |
| GB | 2288066 A | 10/1995 |

(Continued)

OTHER PUBLICATIONS

Clugston, Mike, "Definition of 'cache'," 2004, CREDO reference, formerly Xreferplus, www.xreferplus.com.

(Continued)

*Primary Examiner* — Tuan V. Thai
(74) *Attorney, Agent, or Firm* — Dorsey & Whitney LLP

(57) ABSTRACT

An apparatus and method couples memory devices in a memory module to a memory hub on the module such that signals traveling from the hub to the devices have approximately the same propagation time regardless of which device is involved. Specifically, the devices are arranged around the hub in pairs, with each pair of devices being oriented such that a functional group of signals for each device in the pair, such as the data bus signals, are positioned adjacent each other on a circuit board of the module. This allows for a data and control-address busses having approximately the same electrical characteristics to be routed between the hub and each of the devices. This physical arrangement of devices allows high speed operation of the module. In one example, the hub is located in the center of the module and eight devices, four pairs, are positioned around the hub.

17 Claims, 7 Drawing Sheets

U.S. PATENT DOCUMENTS

| | | | |
|---|---|---|---|
| 4,707,823 A | 11/1987 | Holdren et al. | 370/1 |
| 4,724,520 A | 2/1988 | Athanas et al. | 364/200 |
| 4,809,232 A | 2/1989 | Baumbaugh et al. | 365/221 |
| 4,813,772 A | 3/1989 | Kowel et al. | 350/388 |
| 4,823,403 A | 4/1989 | Twietmeyer | |
| 4,825,208 A | 4/1989 | Mueller et al. | |
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,307,381 A | 4/1994 | Ahuja | 375/107 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,379,382 A | 1/1995 | Work et al. | 395/275 |
| 5,394,528 A | 2/1995 | Kobayashi et al. | 395/325 |
| 5,414,819 A | 5/1995 | Redmond et al. | |
| 5,423,009 A | 6/1995 | Zhu | 710/307 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,493,437 A | 2/1996 | Lebby et al. | 359/152 |
| 5,497,476 A | 3/1996 | Oldfield et al. | 395/439 |
| 5,502,621 A | 3/1996 | Schumacher et al. | 361/760 |
| 5,532,856 A | 7/1996 | Li et al. | 359/118 |
| 5,544,319 A | 8/1996 | Acton et al. | 395/200.07 |
| 5,544,345 A | 8/1996 | Carpenter et al. | |
| 5,566,325 A | 10/1996 | Bruce, II et al. | 395/494 |
| 5,568,574 A | 10/1996 | Tanguay, Jr. et al. | |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,608,264 A | 3/1997 | Gaul | 257/734 |
| 5,613,078 A | 3/1997 | Kishigami | |
| 5,623,534 A | 4/1997 | Desai et al. | 379/59 |
| 5,638,334 A | 6/1997 | Farmwald et al. | 365/230.03 |
| 5,659,798 A | 8/1997 | Blumrich et al. | 395/846 |
| 5,706,224 A | 1/1998 | Srinivasan et al. | 365/49 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,787,475 A | 7/1998 | Pawlowski | 711/137 |
| 5,808,897 A | 9/1998 | Miller, Jr. et al. | 364/490 |
| 5,818,844 A | 10/1998 | Singh et al. | 370/463 |
| 5,818,984 A | 10/1998 | Ahmad et al. | 385/14 |
| 5,819,304 A | 10/1998 | Nilsen et al. | 711/5 |
| 5,822,255 A | 10/1998 | Uchida | 365/194 |
| 5,831,467 A | 11/1998 | Leung et al. | 327/319 |
| 5,832,250 A | 11/1998 | Whittaker | 395/471 |
| 5,872,944 A | 2/1999 | Goldrian et al. | 395/306 |
| 5,875,352 A | 2/1999 | Gentry et al. | 395/843 |
| 5,875,454 A | 2/1999 | Craft et al. | 711/113 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,023,726 A | 2/2000 | Saksena | 709/219 |
| 6,026,098 A | 2/2000 | Kamoi et al. | 370/539 |
| 6,026,226 A | 2/2000 | Heile et al. | 395/500.13 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,078,451 A | 6/2000 | Ioki | 360/51 |
| 6,079,008 A | 6/2000 | Clery, III | 712/11 |
| 6,088,774 A | 7/2000 | Gillingham | 711/167 |
| 6,098,158 A | 8/2000 | Lay et al. | 711/162 |
| 6,101,151 A | 8/2000 | Watanabe et al. | 365/233 |
| 6,105,075 A | 8/2000 | Ghaffari | 710/5 |
| 6,105,088 A | 8/2000 | Pascale et al. | |
| 6,111,757 A | 8/2000 | Dell et al. | 361/737 |
| 6,125,431 A | 9/2000 | Kobayashi | 711/154 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,327 A | 11/2000 | Distinti et al. | 341/126 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,219,725 B1 | 4/2001 | Diehl et al. | 710/26 |
| 6,226,729 B1 | 5/2001 | Stevens et al. | 711/171 |
| 6,229,712 B1 | 5/2001 | Munoz-Bustamante et al. | 361/783 |
| 6,229,727 B1 | 5/2001 | Doyle | 365/63 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,692 B1 | 7/2001 | Yoda et al. | |
| 6,266,730 B1 | 7/2001 | Perino et al. | 710/126 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,343,171 B1 | 1/2002 | Yoshimura et al. | |
| 6,344,664 B1 | 2/2002 | Trezza et al. | 257/82 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,366,375 B1 | 4/2002 | Sakai et al. | |
| 6,366,529 B1 | 4/2002 | Williams et al. | |
| 6,367,074 B1 | 4/2002 | Bates et al. | 717/11 |
| 6,370,068 B2 | 4/2002 | Rhee | 365/196 |
| 6,373,777 B1 | 4/2002 | Suzuki | 365/230.03 |
| 6,381,190 B1 | 4/2002 | Shinkai | 365/230.03 |
| 6,392,653 B1 | 5/2002 | Malandain et al. | 345/501 |
| 6,401,213 B1 | 6/2002 | Jeddeloh | 713/401 |
| 6,405,273 B1 | 6/2002 | Fleck et al. | |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,434,639 B1 | 8/2002 | Haghighi | 710/39 |
| 6,434,654 B1 | 8/2002 | Story et al. | 710/307 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,377 B1 | 9/2002 | Farnworth et al. | |
| 6,453,393 B1 | 9/2002 | Holman et al. | 711/154 |
| 6,457,116 B1 | 9/2002 | Mirsky et al. | 712/16 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,490,188 B2 | 12/2002 | Nuxoll et al. | 365/63 |
| 6,493,784 B1 | 12/2002 | Kamimura et al. | |
| 6,493,803 B1 | 12/2002 | Pham et al. | 711/147 |
| 6,496,909 B1 | 12/2002 | Schimmel | 711/163 |

| Patent No. | Date | Inventor | Class |
|---|---|---|---|
| 6,501,471 B1 | 12/2002 | Venkataraman et al. | 345/424 |
| 6,502,161 B1 | 12/2002 | Perego et al. | 711/5 |
| 6,505,287 B2 | 1/2003 | Uematsu | 711/170 |
| 6,507,899 B1 | 1/2003 | Oberlaender et al. | 711/169 |
| 6,523,092 B1 | 2/2003 | Fanning | 711/134 |
| 6,523,093 B1 | 2/2003 | Bogin et al. | 711/137 |
| 6,526,498 B1 | 2/2003 | Mirsky et al. | 712/11 |
| 6,539,490 B1 | 3/2003 | Forbes et al. | 713/401 |
| 6,552,304 B1 | 4/2003 | Hirose et al. | 219/216 |
| 6,552,564 B1 | 4/2003 | Forbes et al. | 326/30 |
| 6,553,479 B2 | 4/2003 | Mirsky et al. | 712/16 |
| 6,564,329 B1 | 5/2003 | Cheung et al. | 713/322 |
| 6,567,963 B1 | 5/2003 | Trezza | 716/8 |
| 6,570,429 B1 | 5/2003 | Hellriegel | 327/295 |
| 6,584,543 B2 | 6/2003 | Williams et al. | 711/105 |
| 6,587,912 B1 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,599,031 B2 | 7/2003 | Li | |
| 6,615,325 B2 | 9/2003 | Mailloux et al. | 711/154 |
| 6,618,777 B1 | 9/2003 | Greenfield | |
| 6,622,227 B2 | 9/2003 | Zumkehr et al. | 711/167 |
| 6,623,177 B1 | 9/2003 | Chilton | |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |
| 6,636,957 B2 | 10/2003 | Stevens et al. | 711/171 |
| 6,643,787 B1 | 11/2003 | Zerbe et al. | |
| 6,646,929 B1 | 11/2003 | Moss et al. | 365/194 |
| 6,651,139 B1 | 11/2003 | Ozeki et al. | 711/118 |
| 6,658,509 B1 | 12/2003 | Bonella et al. | 710/100 |
| 6,661,940 B2 | 12/2003 | Kim | |
| 6,661,943 B2 | 12/2003 | Li | 385/18 |
| 6,662,304 B2 | 12/2003 | Keeth et al. | 713/400 |
| 6,665,202 B2 | 12/2003 | Lindahl et al. | |
| 6,667,895 B2 | 12/2003 | Jang et al. | 365/63 |
| 6,681,292 B2 | 1/2004 | Creta et al. | 711/119 |
| 6,681,301 B1 | 1/2004 | Mehta et al. | |
| 6,681,341 B1 | 1/2004 | Fredenburg et al. | 714/30 |
| 6,697,926 B2 | 2/2004 | Johnson et al. | 711/167 |
| 6,707,726 B2 | 3/2004 | Nishio et al. | 365/189.12 |
| 6,711,652 B2 | 3/2004 | Arimilli et al. | |
| 6,715,018 B2 | 3/2004 | Farnworth et al. | 710/300 |
| 6,718,440 B2 | 4/2004 | Maiyuran et al. | 711/137 |
| 6,721,187 B2 | 4/2004 | Hall et al. | 361/760 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,113 B2 | 6/2004 | Bhakta et al. | 365/63 |
| 6,751,703 B2 | 6/2004 | Chilton | 711/113 |
| 6,751,722 B2 | 6/2004 | Mirsky et al. | 712/15 |
| 6,752,539 B2 | 6/2004 | Colgan et al. | 385/92 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,772,261 B1 | 8/2004 | D'Antonio et al. | 710/301 |
| 6,775,747 B2 | 8/2004 | Venkatraman | 711/137 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,793,408 B2 | 9/2004 | Levy et al. | 385/88 |
| 6,793,411 B2 | 9/2004 | Seifert | |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,931 B2 | 11/2004 | Shih | 710/62 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,826,160 B1 | 11/2004 | Wang et al. | |
| 6,829,398 B2 | 12/2004 | Ouchi | |
| 6,845,409 B1 | 1/2005 | Talagala et al. | 710/20 |
| 6,889,304 B2 | 5/2005 | Perego et al. | 711/170 |
| 6,910,109 B2 | 6/2005 | Holman et al. | 711/156 |
| 6,910,812 B2 | 6/2005 | Pommer et al. | |
| 6,949,406 B2 | 9/2005 | Bosnyak et al. | |
| 6,950,956 B2 | 9/2005 | Zerbe et al. | 713/400 |
| 6,956,996 B2 | 10/2005 | Gordon et al. | 385/48 |
| 6,961,259 B2 | 11/2005 | Lee et al. | |
| 6,961,834 B2 | 11/2005 | Weber | |
| 6,980,748 B2 | 12/2005 | Leas | 398/202 |
| 6,982,892 B2 | 1/2006 | Lee et al. | |
| 7,000,062 B2 | 2/2006 | Perego et al. | 711/5 |
| 7,016,213 B2 | 3/2006 | Reeves et al. | 365/63 |
| 7,016,606 B2 | 3/2006 | Cai et al. | 398/27 |
| 7,024,547 B2 | 4/2006 | Kartoz | 713/1 |
| 7,035,212 B1 | 4/2006 | Mittal et al. | 370/230 |
| 7,047,351 B2 | 5/2006 | Jeddeloh | |
| 7,062,595 B2 | 6/2006 | Lindsay et al. | 710/315 |
| 7,102,907 B2 | 9/2006 | Lee et al. | |
| 7,106,973 B2 | 9/2006 | Kube et al. | 398/164 |
| 7,120,723 B2 | 10/2006 | Jeddeloh | |
| 7,120,727 B2 | 10/2006 | Lee et al. | |
| 7,120,743 B2 | 10/2006 | Meyer et al. | |
| 7,136,953 B1 | 11/2006 | Bisson et al. | |
| 7,171,508 B2 | 1/2007 | Choi | |
| 7,200,024 B2 | 4/2007 | Taylor | |
| 7,206,887 B2 | 4/2007 | Jeddeloh | |
| 7,242,213 B2 | 7/2007 | Pax et al. | |
| 7,245,145 B2 | 7/2007 | Pax et al. | |
| 7,254,331 B2 | 8/2007 | Murphy | |
| 7,282,947 B2 | 10/2007 | Pax et al. | |
| 7,392,331 B2 | 6/2008 | James et al. | |
| 7,412,571 B2 | 8/2008 | Jeddeloh et al. | 711/151 |
| 7,426,597 B1 | 9/2008 | Tsu et al. | 710/307 |
| 7,447,824 B2 | 11/2008 | Jabori et al. | 710/307 |
| 7,584,336 B2 | 9/2009 | Tremaine | 711/155 |
| 7,793,030 B2 | 9/2010 | Jenkins et al. | 710/307 |
| 7,805,586 B2 | 9/2010 | Ryan | 711/170 |
| 7,827,348 B2* | 11/2010 | Lee et al. | 711/103 |
| 7,870,329 B2* | 1/2011 | Janzen | 711/105 |
| 2001/0023474 A1 | 9/2001 | Kyozuka et al. | 711/114 |
| 2001/0034839 A1 | 10/2001 | Karjoth et al. | 713/190 |
| 2001/0039612 A1 | 11/2001 | Lee | 713/2 |
| 2002/0038412 A1 | 3/2002 | Nizar et al. | 711/170 |
| 2002/0112119 A1 | 8/2002 | Halbert et al. | 711/115 |
| 2002/0116588 A1 | 8/2002 | Beckert et al. | 711/161 |
| 2002/0144064 A1 | 10/2002 | Fanning | 711/144 |
| 2003/0005223 A1 | 1/2003 | Coulson et al. | 711/118 |
| 2003/0043158 A1 | 3/2003 | Wasserman et al. | 345/545 |
| 2003/0043426 A1 | 3/2003 | Baker et al. | 359/109 |
| 2003/0093630 A1 | 5/2003 | Richard et al. | 711/154 |
| 2003/0149809 A1 | 8/2003 | Jensen et al. | 710/22 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0217223 A1 | 11/2003 | Nino, Jr. et al. | 711/105 |
| 2003/0227798 A1 | 12/2003 | Pax | 365/189.12 |
| 2003/0229734 A1 | 12/2003 | Chang et al. | 710/36 |
| 2003/0229770 A1 | 12/2003 | Jeddeloh | 711/213 |
| 2004/0015650 A1 | 1/2004 | Zumkehr et al. | |
| 2004/0022094 A1 | 2/2004 | Radhakrishnan et al. | 365/200 |
| 2004/0024959 A1 | 2/2004 | Taylor | 711/105 |
| 2004/0028412 A1 | 2/2004 | Murphy | 398/135 |
| 2004/0044833 A1 | 3/2004 | Ryan | 711/5 |
| 2004/0044857 A1 | 3/2004 | Jeddeloh | |
| 2004/0047169 A1 | 3/2004 | Lee et al. | 365/63 |
| 2004/0123088 A1 | 6/2004 | Poisner et al. | 713/1 |
| 2004/0126115 A1 | 7/2004 | Levy et al. | 398/116 |
| 2004/0128421 A1 | 7/2004 | Forbes | 710/303 |
| 2004/0144994 A1 | 7/2004 | Lee et al. | 257/200 |
| 2004/0148482 A1 | 7/2004 | Grundy et al. | 711/167 |
| 2004/0230718 A1 | 11/2004 | Polzin et al. | 710/22 |
| 2004/0236885 A1 | 11/2004 | Fredriksson et al. | 710/100 |
| 2004/0251929 A1 | 12/2004 | Pax et al. | 326/30 |

| | | | |
|---|---|---|---|
| 2004/0257890 A1 | 12/2004 | Lee et al. ........................ 365/200 | |
| 2004/0268009 A1 | 12/2004 | Shin et al. | |
| 2005/0030797 A1 | 2/2005 | Pax et al. .................. 365/189.12 | |
| 2005/0044304 A1 | 2/2005 | James | |
| 2005/0044327 A1 | 2/2005 | Howard et al. ................ 711/147 | |
| 2005/0071542 A1 | 3/2005 | Weber et al. .................. 711/105 | |
| 2005/0091464 A1 | 4/2005 | James ........................... 711/167 | |
| 2005/0105350 A1 | 5/2005 | Zimmerman | |
| 2005/0162882 A1 | 7/2005 | Reeves et al. .................... 365/63 | |
| 2005/0177690 A1 | 8/2005 | LaBerge ........................ 711/154 | |
| 2005/0210185 A1 | 9/2005 | Renick | |
| 2005/0210216 A1 | 9/2005 | Jobs et al. ..................... 711/170 | |
| 2005/0216648 A1 | 9/2005 | Jeddeloh ........................ 710/311 | |
| 2005/0216677 A1 | 9/2005 | Jeddeloh et al. .............. 711/150 | |
| 2005/0257021 A1 | 11/2005 | James ........................... 711/170 | |
| 2005/0268060 A1 | 12/2005 | Cronin et al. | |
| 2006/0023528 A1 | 2/2006 | Pax et al. ........................ 365/202 | |
| 2006/0023633 A1 | 2/2006 | Caruk et al. .................. 370/252 | |
| 2006/0047891 A1 | 3/2006 | James et al. .................. 711/105 | |
| 2006/0179208 A1 | 8/2006 | Jeddeloh | |
| 2006/0195647 A1 | 8/2006 | Jeddeloh | |

FOREIGN PATENT DOCUMENTS

| | | |
|---|---|---|
| JP | 2001265539 A | 9/2001 |
| WO | WO 93/19422 | 9/1993 |
| WO | WO 02/27499 A2 | 4/2002 |

OTHER PUBLICATIONS

Depari, A. et al, "USB Sensor Network for Industrial Applications", Instrumentation and Measurement Technology Conference, 2004, IMTC 04, Proceedings of the 21$^{st}$ IEEE, vol. 2, May 2004, Abstract only. One page.

Gillingham, Peter, SLDRAM Architectural and Functional Overview, 1997 SLDRAM Consortium, Aug. 29, 1997, p. 14.

Gommans, L. et al., "Applications drive secure lightpath creation across heterogeneous domains", Communications Magazine, IEEE, vol. 44, Issue 3, Mar. 2006. Abstract only.

Hsieh, M. et al., "On the Design of a Local Switch for Heterogenous Multi-Subsystem Interconnect", TENCON '93, Proceedings, Computer, Communications, Control and Power Engineering, 1993, IEEE Region 10 Conference, vol. 3, Oct. 1993. Abstract Only. One page.

Tanenbaum, Andrew, "Structured Computer Organization", 1990, Third Edition, pp. 11-13.

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

Gillett, R. et al., "Using the Memory Channel Network", Micro, IEEE, vol. 17, No. 1, Jan.-Feb. 1997, Abstract only. Two pages.

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

Webster's New World Computer Dictionary, Wiley Publishing, Inc., copyright 2003.

Omkar et al., "Neural Network Controller for Minimizing Hub Shear Forces in Helicopter", IEEE XPLORE, Abstract Only.

Scott et al., "An Overview of the Visualize fx Graphics Hardware", May 1998, pp. 29.

Scott, Noel D. et al., "An Overview of the Visualize fx Graphics Accelerator Hardware", The Hewlett-Packard Journal, Article 4, pp. 28-34.

Tanenbaum, "Structured Computer Organization", 3rd Edition, 1990, pp. 11-13.

* cited by examiner

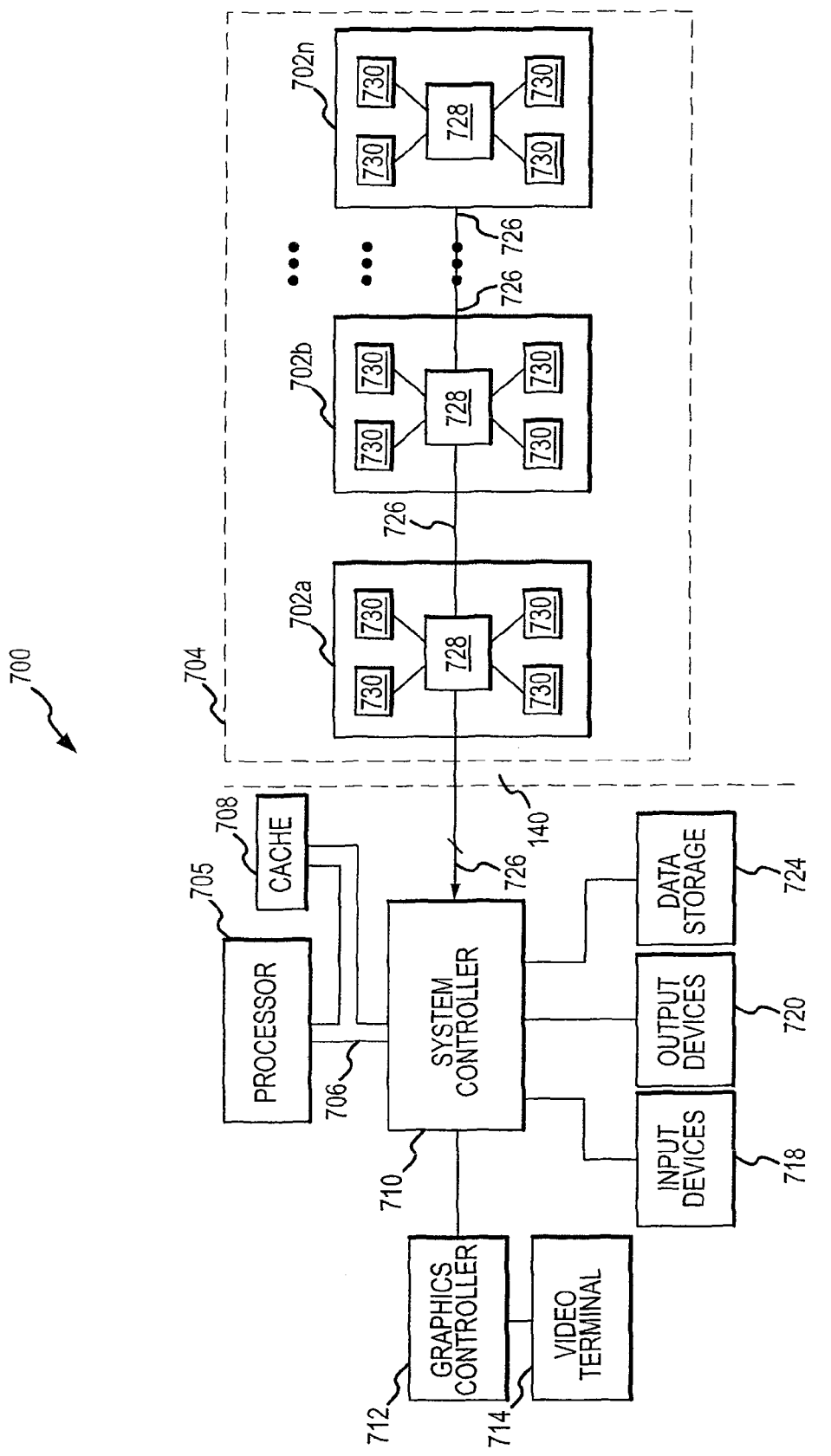

SYSTEM AND METHOD FOR OPTIMIZING INTERCONNECTIONS OF COMPONENTS IN A MULTICHIP MEMORY MODULE

CROSS-REFERENCE TO RELATED APPLICATIONS

This application is a continuation of U.S. patent application Ser. No. 11/417,389, filed May 3, 2006, U.S. Pat. No. 7,870,329, which is a continuation of U.S. patent application Ser. No. 10/822,275, filed Apr. 8, 2004, U.S. Pat. No. 7,590,797. These applications are incorporated by reference herein in their entirety and for all purposes.

TECHNICAL FIELD

The present invention relates generally to computer memory modules, and, more specifically, to methods and apparatus for improving signal integrity between a memory hub or other component on a memory module and memory devices contained on the memory module.

BACKGROUND OF THE INVENTION

A main focus of the contemporary semiconductor industry is the creation of smaller, faster, higher density, and more efficient memory modules. These efforts are often frustrated by cross talk and skew of signals being communicated on and to the memory modules, particularly as the memory modules become smaller. Cross talk is an inductive effect which can arise when a variable current flows through a conductor. Variable current creates a corresponding variable magnetic field surrounding the conductor capable of inducing a disruptive signal in any adjacent conductors passing through the magnetic field. As a consequence, the placement of conductors in a memory module must be carefully engineered in order to maintain suitable distances of separation between conductors to minimize the effects of cross talk.

Skew is a relatively fixed differential delay between two signals, commonly the result of the signals traveling different path lengths. One technique to eliminate skew is to make the path lengths along which signals are coupled the same length. In this way, signal travel time will be the same, thus eliminating any differential delay. Overall, the necessity of such careful considerations in both distancing conductors from each other and in creating equivalent path lengths to minimize the effects of cross talk and skew complicates efforts to produce effective memory modules with small dimensions.

Generally, memory modules are comprised of individual memory devices coupled in parallel on a circuit board. These memory devices can be dynamic random access memory ("DRAM") devices suitable for a wide variety of applications. A partial top plan view of one type of memory module known in the art is shown in FIG. 1. As illustrated, two registered dual in-line memory modules (DIMM) 100a, 100b include a plurality of memory devices 102-116 arranged on a circuit board 140 and connected by a command/address bus 142 to a register 144. The memory devices 102-116 and the conductors of the command/address bus 142 are situated on the circuit board 140 with enough space between them to minimize any cross talk. The register 144 receives command signals applied through a control bus 146 and address signals applied through an address bus 148 from an external memory controller (not shown), such as what is typically referred to as a "north bridge controller" in a conventional computer system.

As illustrated in the registered memory module 100 shown in FIG. 1, the command signals applied to the register 144 include a row address strobe signal ("RAS#") (the "#" indicates the signal is active low), a column address strobe signal ("CAS#"), clock enable signals ("CKE0" and "CKE7"), a write enable signal ("WE#") and chip select signals ("CS0#"-"CS7#") to activate the DRAM devices 102-116 on the respective memory modules 100a, 100b. Other signals not latched by the register 144 include a clock ("CK0") signal, data signals ("DQ0-DQ63") corresponding to a 64-bit data word applied to the modules through a data bus 150, and a number of other signals that are not pertinent to the present discussion. In the registered DIMMs 100a, 100b, bank address signals ("B0-B7") corresponding to an 8-bit bank address and row/column address signals ("A0-A12") corresponding to a 13-bit address are also applied to the register 144 through the address bus 148. Typically, groups of the DRAM devices 102-116 are coupled to respective chip select signals CS0#-CS7#, with each group receiving a given chip select signal being designated a "rank" of memory. In the following discussion, each DIMM 100a, 100b is assumed to include memory devices 102-116 on both sides of the DIMM, and groups of 4 memory devices (e.g., 102-108 and 110-116) are coupled to respective chip select signals CS0#-CS7# to define 4 ranks per DIMM. Each memory device 102-116 is thus a X16 device, meaning that each of the 4 memory devices in a given rank provides 16 of the 64 bit data bus DQ0-DQ63.

In operation, when a computer processor (not shown) reads data from, or writes data to, a specific memory address in a particular rank of memory device 102-116, it sends a signal to the memory controller (not shown) over a host bus (also not shown). The request is analyzed by the memory controller, which applies corresponding address signals A0-A12 and the previously described command signals to the registered DIMMs 100a-b. These signals are latched into the registers 144 of both of the DIMMs 100a-b, with the latched chip select signals CS0#-CS7# determining the rank of memory that is accessed. Only one chip select signal CS0#CS7# is activated to access the corresponding rank of memory on one of the DIMMs 100a-b.

During write operations, the command signal includes address signals and command signals enabling the memory controller to access and write to a specific address in a respective rank of memory. Write data bits DQ0-DQ63 from the data bus 150 are then applied over an internal data path (not shown for the sake of clarity) on the DIMMs to the memory devices 102-116, and the memory devices in the active rank store the write data. The internal data path consists of individual traces running from the memory devices 102-116 to signal traces (not shown) on an edge of the circuit board 140. During write operations, the register 144 also operates to generate the appropriate command and timing signals to control the memory devices 102-116.

During read operations, the command signal includes address signals and command signals enabling the memory controller to access and read data from a specific address within the activated rank of memory. The read data stored in the active rank are then applied over the internal data path to the data bus 150 and, in turn, to the memory controller as read data bits DQ0-DQ64.

As can be seen in FIG. 1, the off-module command and address signals are applied to the midpoint of the module 100 such that the length of the control bus 146 and the address bus 148 on the module 100 are short. However, since the memory devices 102-116 are disposed on either side of the register 144, the path lengths of the command/address bus 142 to the memory devices 102-116 are of different lengths. As a result, address and command signals coupled from the register 144 to the different memory devices 102-116 are susceptible to skew. For example, the difference in delay in coupling command and address signals from the register 144 to the memory devices 102 and 108 makes it difficult to capture the command and address signals at both memory devices with a common clock signal. This potential for signal skew can seriously limit the operating speed of the memory devices 102-116.

One way to solve this problem is to increase the path lengths of the command/address bus 142 coupled to the memory devices 104-114 to make them equal to the path length of the command/address bus 142 to the devices 102 and 116. While such a solution is effective in alleviating skew, it requires the placement of a greater length of conductive lines on the DIMMs 100a, 100b. This consumes more space, increases propagation delay, and may adversely affect signal integrity. Further, as memory bus speeds continue to increase, a need will arise to buffer data signals along with the command address signals such that a data buffer will be included on each memory module 100a, 100b to perform a similar function for data signals as the register 144 does for command and address signals.

A new computer memory architecture currently being developed is known as a memory hub architecture. In a memory hub architecture, a system controller or memory controller is coupled over a high-speed data link, such as a fiber optic link, to several memory modules. The memory modules are typically coupled in a point-to-point or daisy chain architecture such that the memory modules are connected one to another in series. Each memory module includes a memory hub that is coupled to the corresponding high-speed data links and is also coupled to a number of memory devices on the module. The memory hubs efficiently route memory requests and responses between the controller and the memory devices via the high-speed data links. Computer systems employing this architecture can have a higher bandwidth because a processor can access one memory device or rank of memory while another memory device or rank is responding to a prior memory access. For example, the processor can output write data to one rank of memory in the system while another rank is preparing to provide read data to the processor.

The command, address, and data signals between each memory hub and the corresponding memory devices can experience cross talk and skew just as do the signals on conventional memory modules as previously discussed. To increase the overall bandwidth of a memory utilizing the memory hub architecture, the signals between the hub and memory devices are very high-speed, which only exacerbates the problems created by any skew due to the more restrictive timing requirements, as will be understood by those skilled in the art. If each memory module has a layout like the DIMMs 100a, 100b of FIG. 1, layout and routing congestion problems arise. With the memory hub being positioned in the center of the circuit board 140 in place of the register 144 and the DRAMs 102-116 positioned as shown, the skew of signals to and from each DRAM 102-116 is different.

This skew presents timing problems for the memory hub, particularly with regard to read data from the DRAMs which will arrive at the hub at different times yet must be accurately captured. The hub could execute a synchronization process for each DRAM, but this would increase the complexity and cost of the memory hub. Routing congestion problems also arise with this layout due to all the signals that must be routed between the devices and the hub. While more layers could be added to the circuit board 140, this increases the complexity and cost of the board.

There is a need for a memory module that minimizes skew and maximizes signal integrity between a memory hub and memory devices as well as between the module and a memory controller.

BRIEF DESCRIPTION OF THE DRAWINGS

FIG. 7 is a block diagram of a computer system including a system memory having a memory hub architecture formed by one or more of the memory modules of FIGS. 2 and 4-6.

DETAILED DESCRIPTION OF THE INVENTION

Figure 1:
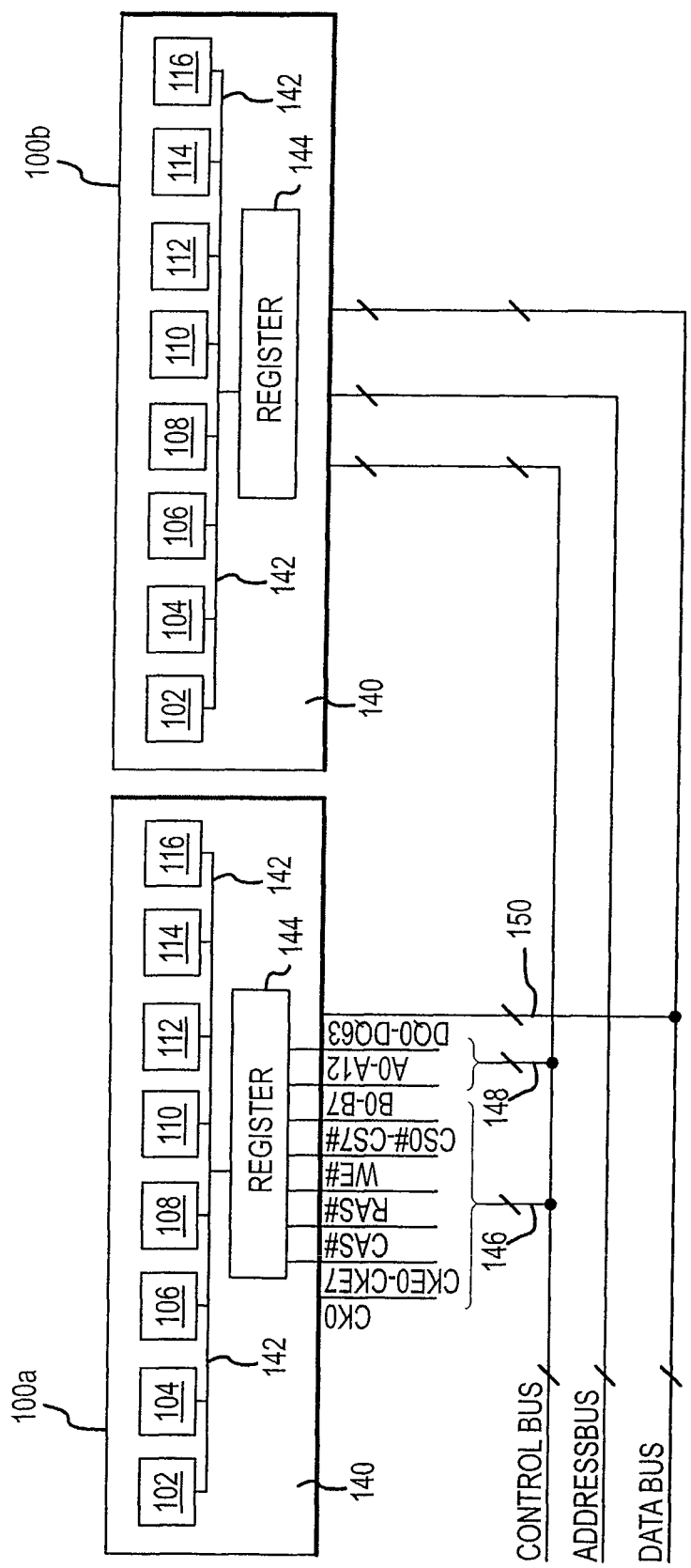
FIG. 1 is a block diagram of a portion of a conventional computer memory system containing a plurality of conventional DIMMs.
Figure 2:
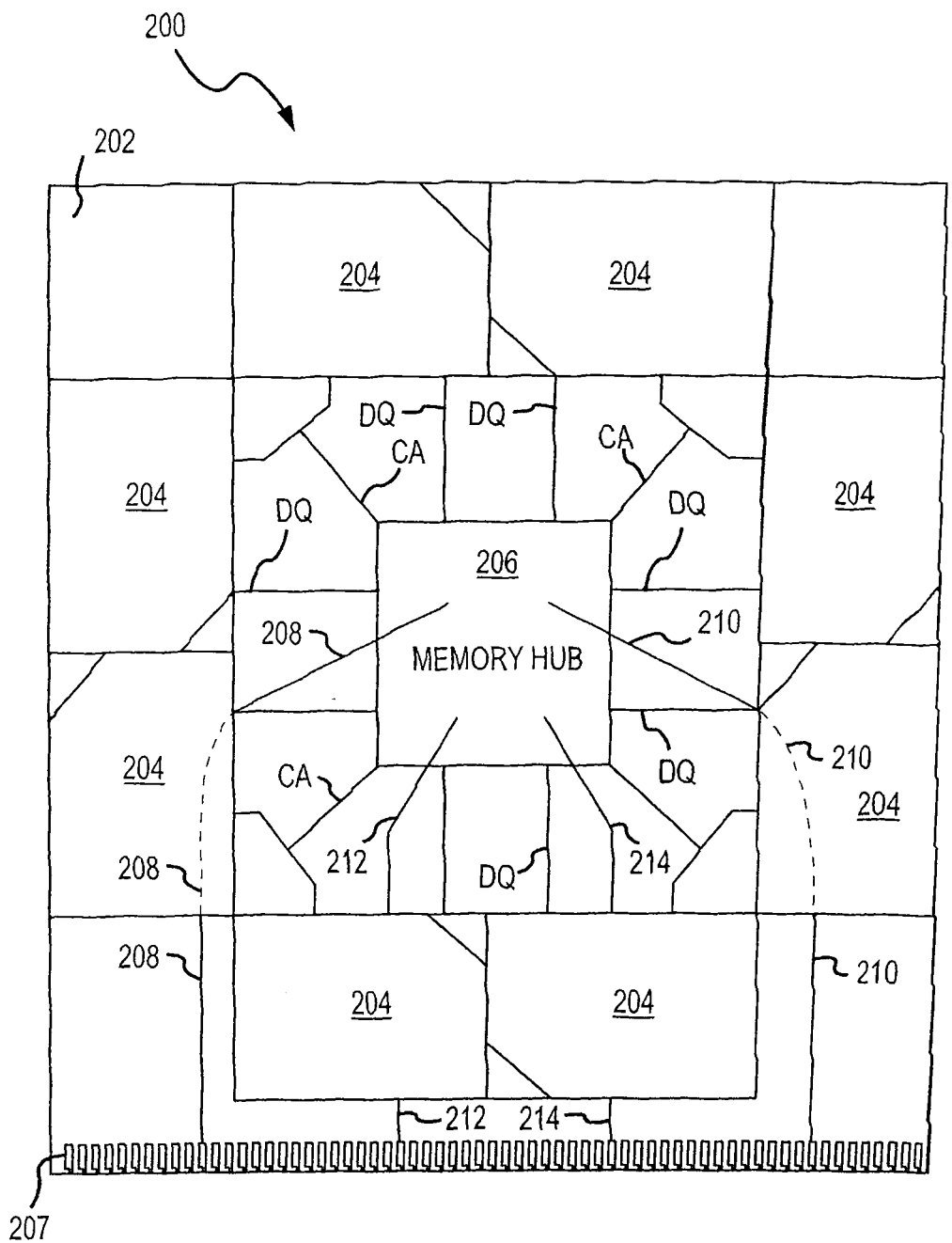
FIG. 2 is a schematic top view of a memory module including a circuit board on which a number of memory devices are physically positioned around a memory hub according to one embodiment of the present invention.

FIG. 2 is a schematic top view of a memory module 200 including a circuit board 202 on which eight memory devices 204 are physically positioned around a memory hub 206 and are physically oriented to minimize the skew of signals among the memory devices according to one embodiment of the present invention. The position and orientation of each memory device 204 is such that the electrical characteristics of conductive lines or busses interconnecting the memory device and the memory hub 206 are substantially the same for all memory devices, minimizing the skew of signals among the memory devices and thereby allowing for high-speed operation of the memory module as will be described in more detail below. In the following description, certain details are set forth to provide a sufficient understanding of the present invention. One skilled in the art will understand, however, that the present invention may be practiced without these particular details.

Figure 3:
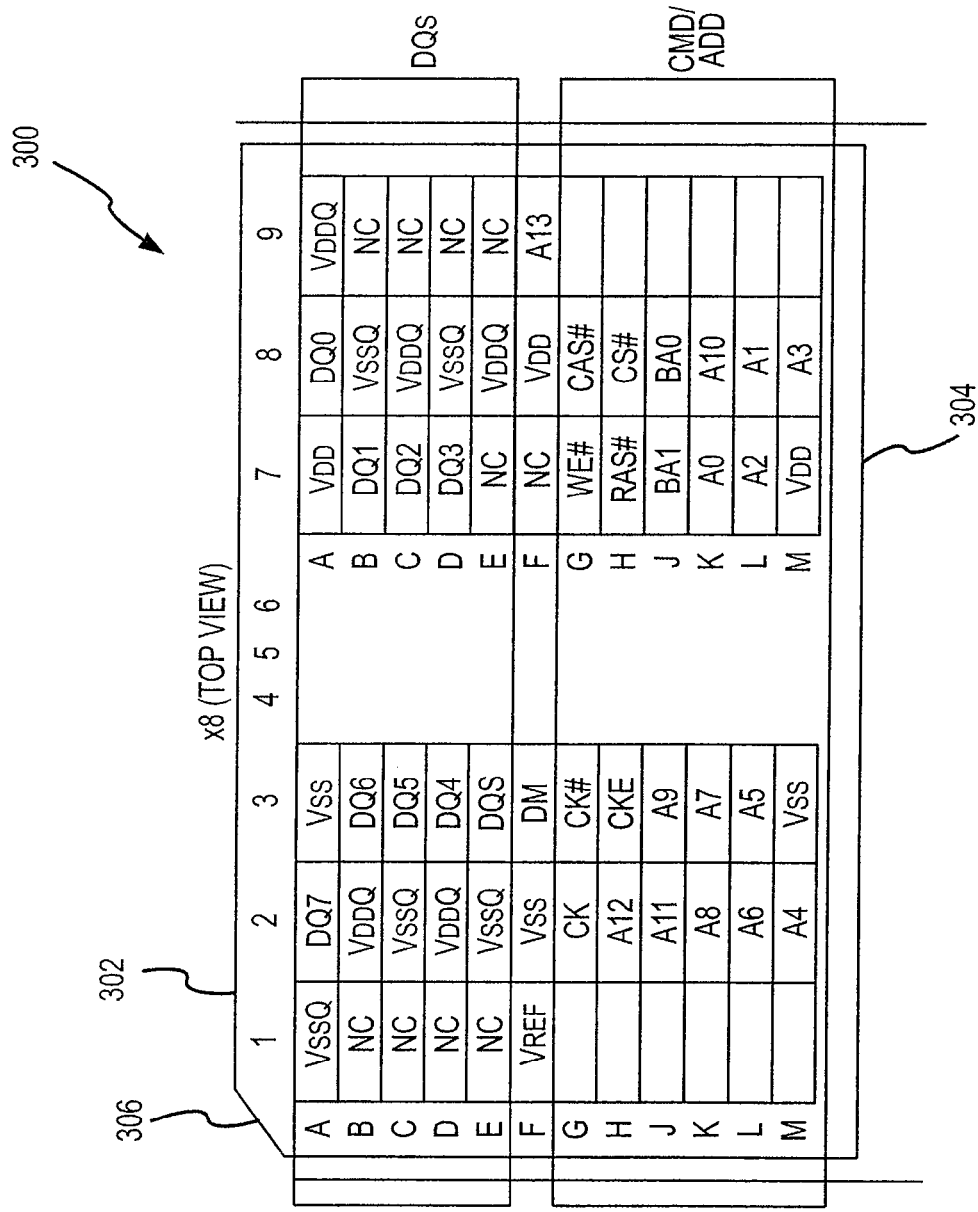
FIG. 3 is a top view of a conventional DRAM illustrating the physical location of data, address, and control pins.

The construction of the memory module 200 assumes a particular physical layout for pins or "pin out" for each of the memory devices 204. As a result, the assumed pin out for the memory devices 204 will first be described in more detail with reference to FIG. 3, which is a top view of a conventional DRAM 300 illustrating the physical location of data, address, and control pins. FIG. 3 shows that the data bus pins DQ0-7 are physically grouped toward one end 302 of the DRAM 300, while the control-address pins are physically grouped toward an opposite end 304. A pin 1 designator 306 in the upper left corner of the DRAM 300 is shown so that the orientation of the DRAM may be determined from the location of this pin 1 designator. This pin out is typical for high volume DRAMs and is assumed for the memory devices 204 of FIG. 2 and for all other embodiments of the present invention described herein. The exact number and location of data and control-address pins may vary as long as data pins are grouped toward one end of the memory device 204 and control-address pins grouped toward another end of the DRAM.

Returning now to FIG. 2, the memory hub 206 is coupled to each of the memory devices 204 through a respective data bus DQ. The DRAMs 204 are positioned in pairs, with each pair being located adjacent a given edge of the circuit board 202 and centered relative to the corresponding other two edges of the circuit board. For example, one pair of DRAMs 204 is positioned near the top edge of the circuit board 202 and centered relative to the left and right edges of the board. One DRAM 204 in each pair is rotated 180 degrees relative to the other, positioning the pin 1 designated edges of the DRAMs adjacent one another. By positioning the memory devices 204 in this configuration, the data bus DQ of each memory device has substantially identical electrical characteristics since each bus is approximately the same length. This minimizes skew among the data busses DQ as previously discussed.

The memory hub 206 is also coupled to each memory device 204 through a corresponding control-address bus CA. Once again, due to the physical positioning of the memory devices 204, the CA bus routed to each memory device has substantially the same electrical characteristics. This is true because, as shown in FIG. 2, each CA bus is routed diagonally toward a corner of the board 202 and couples to the control-address pins of the memory devices 204, which are located opposite the pin 1 designator 306 and thus near the edges of the corresponding memory devices near the corners of the board 202.

The memory hub 206 is further coupled to an edge connector 207 positioned on a bottom edge of the circuit board 202 through control-address busses 208, 210 and data busses 212, 214. The busses 208-214 collectively form a "system bus" of the memory module 200 and couple the memory hub 206 to a high-speed data link (not shown). The dotted lines for the busses 208, 210 merely indicate that these busses may be routed under the corresponding memory devices 204. The layout of the memory hub 206 and memory devices 204 allows the busses 208-214 to be routed relatively directly from the edge connector 207 to the memory hub so that the lines forming each bus have relatively the same electrical characteristics, minimizing skew among signals within the busses, as will be appreciated by those skilled in the art.

In operation, the memory hub 206 receives memory requests from the high-speed data link (not shown) and, in response to such signals, applies address, data, and control signals to the memory devices 204 to thereby transfer data to and from the memory devices. The memory hub 206 initially processes downstream memory requests from a memory controller (not shown) directed to one of the memory modules 200 in a system memory to determine if the request is directed to the particular module, and only accesses the memory devices 204 when this is true. The hub 206 also processes upstream return requests from downstream memory modules 200, such as return requests including read data from a downstream module. As part of the processing of requests, the memory hub 206 translates requests from the high-speed data links into corresponding commands to properly access the memory devices 204, and also may include conversion circuitry to convert, for example, optical signals from the high-speed data link into electrical signals. The architecture and operation of a system memory having a daisy-chain memory hub architecture including the memory module 200 will be described in more detail below with reference to FIG. 7.

In one embodiment of the memory module 200, each of the memory devices 204 as a 9-bit data bus DQ and all of the memory devices are in the same rank. Accordingly, the DQ busses 212, 214 are each 36-bits wide to thereby form a 72-bit wide data bus of the memory module 200. In another embodiment, the memory module 200 includes two ranks of memory, with the second rank being formed by memory devices 204 (not shown) positioned on a back side of the circuit board 202 in the same way as just described for the memory devices on a front side of the board. More specifically, for each memory device 204 on the front side of the board 202 a corresponding device is positioned on the back side of the board with the same orientation (i.e., the pin 1 designated ends of devices on the back are adjacent the pin 1 designated ends of corresponding devices on the front side).

By positioning the memory devices 204 and memory hub 206 in this way, the electrical characteristics of the data bus DQ routed to each memory device is substantially the same for all the data busses, reducing skew among data busses and thereby allowing higher speed operation of the memory module 200. The same is true for the control-address busses CA routed to each memory device 204. The positioning of the memory devices tool for and memory hub two of six also allows for relatively direct interconnection between the memory hub and to the edge connector 207 through the busses 208-214. As previously mentioned, this reduces skew among data lines in the busses 208-214 to thereby allow for higher speed data transfer between the hub and edge connector.

Figure 4:
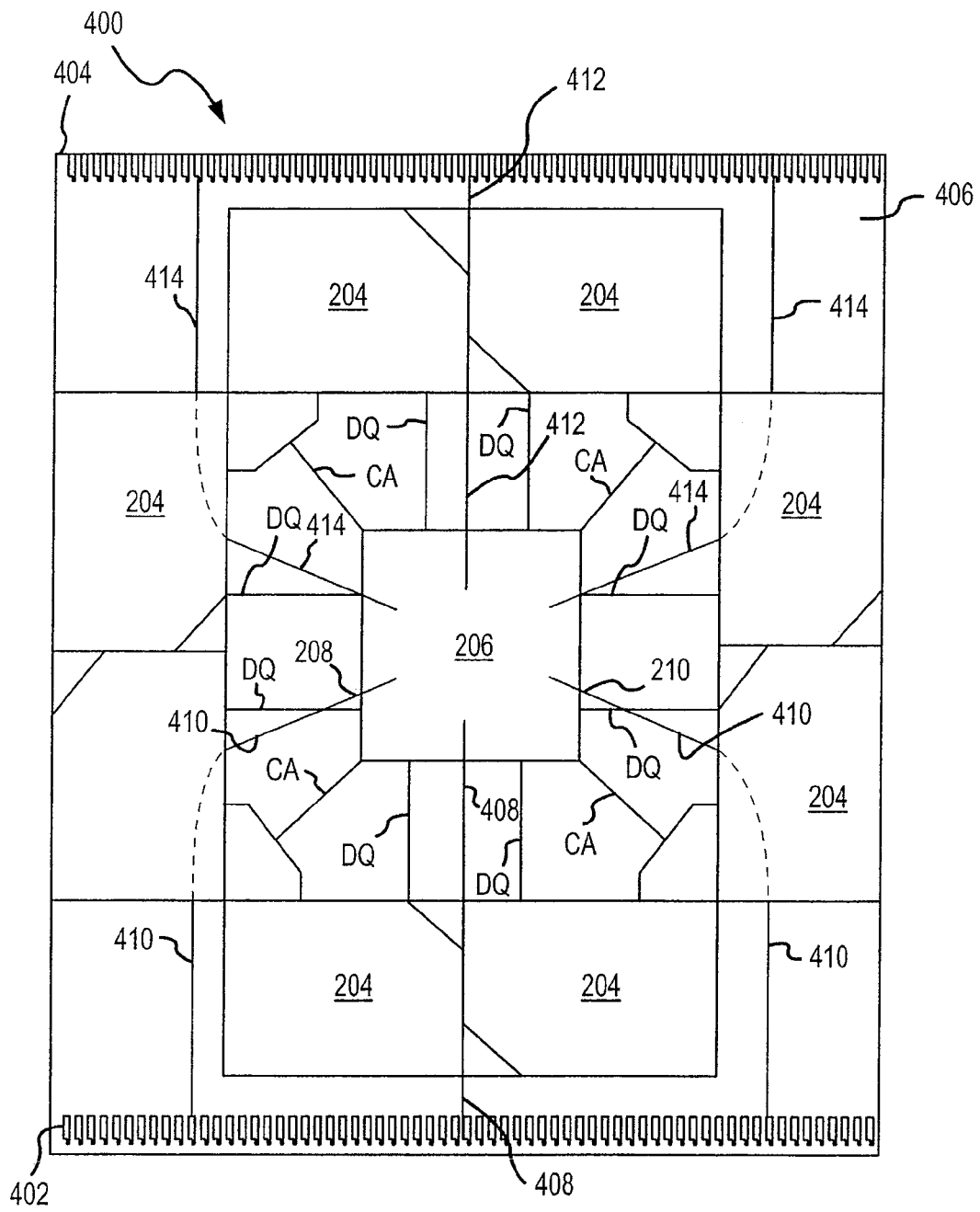
FIG. 4 is a schematic top view of a memory module similar to the memory module of FIG. 2 but including dual edge connectors to reduce the pin count of each connector according to another embodiment of the present invention.

FIG. 4 is a schematic top view of a memory module 400 according to another embodiment of the present invention. The memory module 400 is similar to the memory module 200 of FIG. 2, but instead of the single edge connector 207 this memory module includes a lower edge connector 402 and an upper edge connector 404 positioned along a bottom and a top edge, respectively, of a circuit board 406. Components in the memory module 400 that are the same as previously described for the memory module 200 of FIG. 2 and given the same reference designations in FIG. 4, and for the sake of brevity will not again be described in detail. The memory hub 206, memory devices 204, and the DQ and CA busses between the hub and memory devices are the same as corresponding components in the memory module 200.

In the memory module 400, a lower data bus 408 and lower control-address bus 410 are coupled between the lower edge connector 402 and the memory hub 406, while an upper data bus 412 and an upper control-address bus 414 are coupled between the upper edge connector 404 and the memory hub. Typically, half the lines of the overall bus or system bus of the memory module 400 would correspond to the lower data bus 408 and half to the upper data bus 412, and the same for the lower and upper control-address busses 410, 414. Recall, the memory module 400 would typically be connected to other modules in a daisy-chain architecture, and the use of the dual edge connectors 402, 404 enables one of the edge connectors to include the pins required for all signal lines of the system bus coupled to a downstream memory module and the other edge connector to include the pins required for all signal lines of the system bus coupled to an upstream memory module. The memory module 400 is useful in applications where the total number of pins required for the edge connector 207 may be more than can be economically or technically included in a single edge connector. The dual edge connectors 402, 404 may also simplify routing the signal lines for the system bus corresponding to the lines of the busses 408-414.

Figure 5:
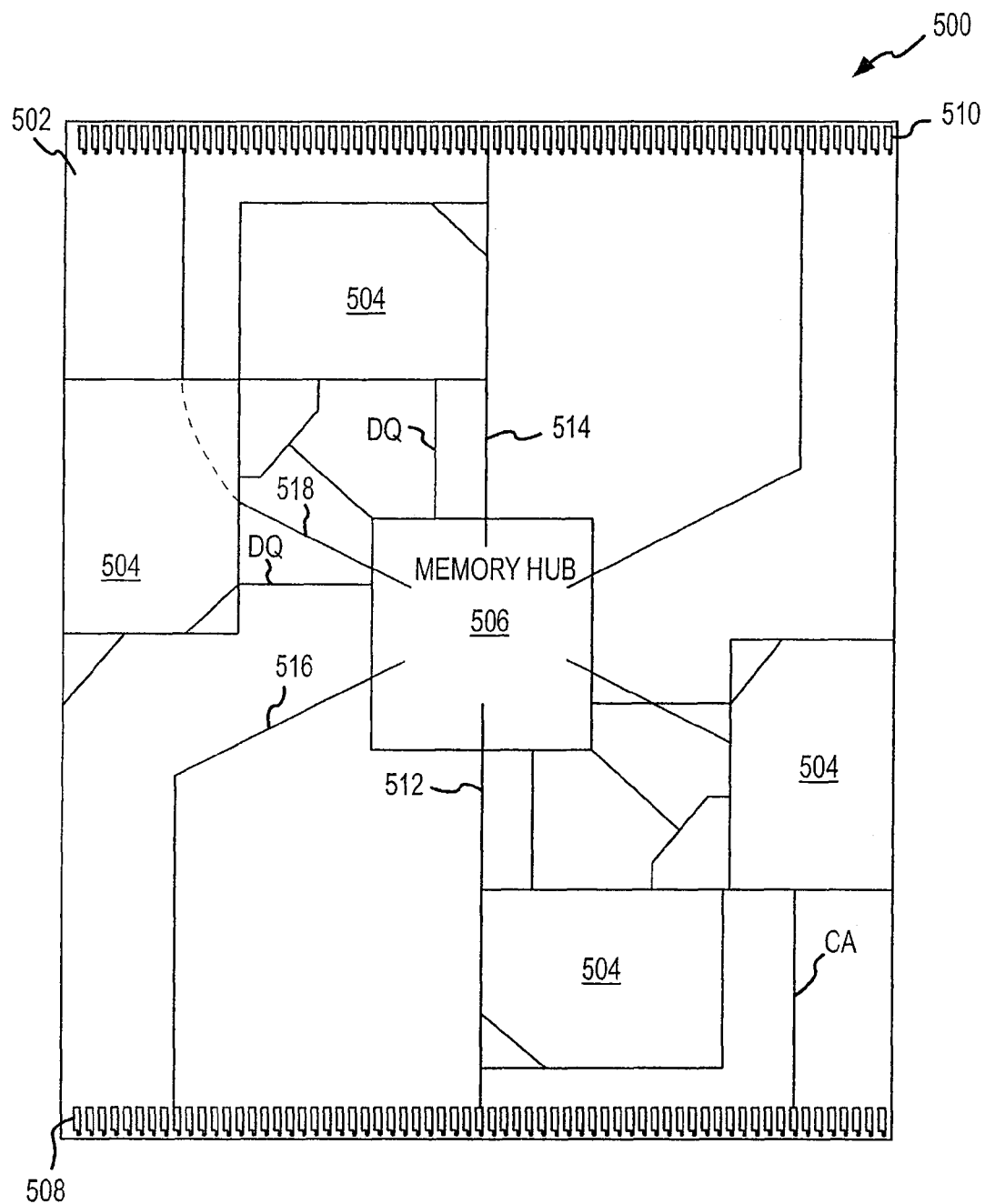
FIG. 5 is a schematic top view of a memory module including a circuit board on which a number of wide data bus memory devices are physically positioned around a memory hub according to a further embodiment of the present invention.

FIG. 5 is a schematic top view of a memory module 500 including a circuit board 502 on which a number of wide data bus memory devices 504 are physically positioned around a memory hub 506 according to a further embodiment of the present invention. The memory module 500 is similar to the memory module 400 of FIG. 4, but instead of including eight memory devices 204 positioned around the memory hub 206 the module 400 includes only four memory devices 504. In the memory module 500, each of the memory devices 504 is assumed to have a data bus DQ that is twice the width of the data bus DQ of the memory devices 204. As a result, only half the number of memory devices 504 is required, with the routing of the data busses DQ and control-address busses CA between the memory devices and the memory hub 506 being similar to the corresponding memory devices on the memory modules 200 and 400. More specifically, the devices 504 are oriented such that the ends of each device near which the control-address pins are located (i.e., the ends opposite the pin 1 designators) are adjacent a corresponding corner of the circuit board 502.

The memory module 500 includes a lower edge connector 508 and an upper edge connector 510 positioned along a bottom and a top edge, respectively, of the circuit board 502. The memory hub 506 is coupled through a lower data bus 512 and a lower control-address bus 516 to the edge connector 508, and through an upper data bus 514 and upper control-address bus 518 to the edge connector 510. Alternatively, in another embodiment the module 500 includes only the lower edge connector 508 and the both pairs of memory devices 504 are positioned on the bottom half of the circuit board 502. This allows the size of the circuit board 502 to be reduced to half the size if desired. Once again, if more than one rank is to be contained on the module 500, the additional memory devices 504 are positioned on a back side of the circuit board 502 in the same way. Cutting the number of memory devices 504 in the memory module 500 in half reduces the heat dissipation of the module. In one embodiment, each memory device 504 has an 18-bit wide data bus DQ so that the memory module 500 has a 72-bit wide system bus, which is the same as the memory modules 200 and 500.

Figure 6:
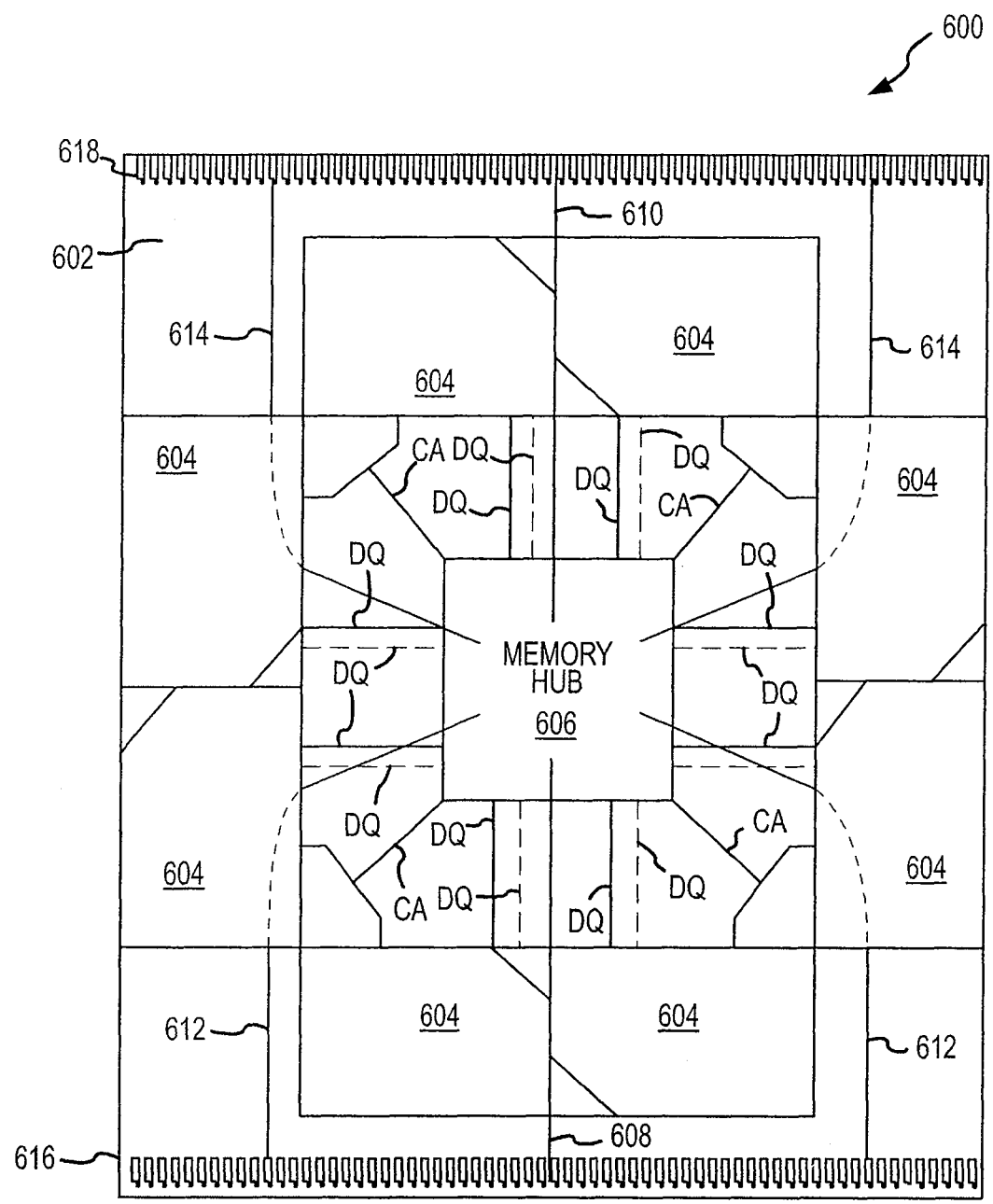
FIG. 6 is a schematic top view of a memory module including a circuit board on which a number of low-width DRAMs are physically positioned around a memory hub according to a further embodiment of the present invention.

FIG. 6 is a schematic top view of a memory module 600 including a circuit board 602 on which a number of low-width memory devices 604 are physically positioned around a memory hub 606 according to a further embodiment of the present invention. The routing of data busses DQ and control-address busses CA between the hub 606 and devices 604 is analogous to that previously described for the memory module 400 of FIG. 4, and the same is true of data busses 608, 610 and control-address busses 612, 614 that collectively for the module system bus coupled between the hub and edge connectors 616, 618. As a result, such interconnections and positioning of components will not again be described in detail. The module 600 further includes eight memory devices 604 on a back side of the circuit board 602, each of these memory devices including an independent data bus DQ coupled to the memory hub 606, as illustrated by the dotted data busses DQ in FIG. 6.

The memory module 600 would typically be utilized in applications where very high reliability of the module is required, such as in server systems where gigabytes of data may be stored in DRAM memory modules and the failure of one of the modules would result in the loss of significant amounts of data. With the module 600, each memory device 604 could be used to provide only a single bit of data to each data word being processed so that a failure of any of the individual memory devices may be corrected through error checking and correcting (ECC) techniques, as will be appreciated by those skilled in the art. Such ECC techniques can detect and correct single bit errors in a given data word but can only detect and not correct multiple bit errors. Thus, the reliability of the module 600 is improved, as required in many computer systems such as server systems as previously described. The memory hub 606 operates to properly address data stored in the memory devices 604 such that each device provides a single bit of a given data word on the system bus, as will be appreciated by those skilled in the art. In one embodiment, half the memory devices 604 have 4-bit data busses DQ and half have 5-bit data busses DQ as indicated in FIG. 6.

Although the memory devices on each of the memory modules 200, 400, 500 and 600 are described as being DRAMs, other types of memory devices could also be utilized, as will be appreciated by those skilled in the art. Moreover, the number and orientation of memory devices on a given memory module will vary depending on the particular application for which the memory module is being designed, and the embodiments of FIGS. 2, 4, 5, and 6 are merely examples of a myriad of different physical layouts that are part of the present invention.

FIG. 7 is a functional block diagram of a computer system 700 including a plurality of memory modules 702a-n corresponding to one or more of the memory modules 200 and 400-700 of FIGS. 2 and 4-7, respectively, according to one embodiment of the present invention. The memory modules 702a-n form a system memory 704 having a daisy-chain memory hub architecture as previously discussed. The computer system 700 includes a processor 705 for performing various computing functions, such as executing specific software to perform specific calculations or tasks. The processor 705 includes a processor bus 706 that normally includes an address bus, a control bus, and a data bus. The processor bus 706 is typically coupled to cache memory 708, which, as previously mentioned, is usually static random access memory ("SRAM"). Finally, the processor bus 706 is coupled to a system controller 710, which is also sometimes referred to as a "North Bridge" or "memory controller."

The system controller 710 serves as a communications path to the processor 705 for a variety of other components. More specifically, the system controller 710 includes a graphics port that is typically coupled to a graphics controller 712, which is, in turn, coupled to a video terminal 714. The system controller 710 is also coupled to one or more input devices 718, such as a keyboard or a mouse, to allow an operator to interface with the computer system 100. Typically, the computer system 100 also includes one or more output devices 720, such as a printer, coupled to the processor 705 through the system controller 710. One or more data storage devices 724 are also typically coupled to the processor 705 through the system controller 710 to allow the processor 705 to store data or retrieve data from internal or external storage media (not shown). Examples of typical storage devices 724 include hard and floppy disks, tape cassettes, compact disk memories (CDs), and other types of fixed or removable storage media.

The system controller 710 is further coupled to the memory modules 702a-n in a point-to-point or daisy chain architecture through respective high-speed links 726 coupled between the modules and the system controller 710. More specifically, each memory module 702a-n includes a memory hub 728 coupled to corresponding high-speed links 726, where each memory hub 728 communicates over the corresponding high-speed links and controls access to a number of memory devices 730 contained on the memory module.

The high-speed links 726 may be optical, RF, or electrical communications paths, or may be some other suitable types of communications paths, as will be appreciated by those skilled in the art. In the event the high-speed links 734 are implemented as optical communications paths, each optical communication path may be in the form of one or more optical fibers, for example. In such a system, the system controller 710 and the memory modules 702*a-n* will each include an optical input/output port or separate input and output ports coupled to the corresponding optical communications paths.

Although the memory modules 702*a-n* are shown coupled to the system controller 710 in a daisy architecture, other topologies may also be used, such as a switching topology in which the system controller 710 is selectively coupled to each of the memory modules 702*a-n* through a switch (not shown), or a multi-drop architecture in which all of the memory modules 702*a-n* are coupled to a single high-speed link 726.

Other topologies which may be used, such as a ring topology, will be apparent to those skilled in the art. One skilled in the art will also understand suitable circuitry for forming the memory hubs 206.

In the preceding description, certain details were set forth to provide a sufficient understanding of the present invention. One skilled in the art will appreciate, however, that the invention may be practiced without these particular details. Furthermore, one skilled in the art will appreciate that the example embodiments described above do not limit the scope of the present invention, and will also understand that various equivalent embodiments or combinations of the disclosed example embodiments are within the scope of the present invention. Illustrative examples set forth above are intended only to further illustrate certain details of the various embodiments, and should not be interpreted as limiting the scope of the present invention. Also, in the description above the operation of well known components has not been shown or described in detail to avoid unnecessarily obscuring the present invention. Finally, the invention is to be limited only by the appended claims, and is not limited to the described examples or embodiments of the invention.

The invention claimed is:

1. A memory module comprising;
 a circuit board including an edge;
 a memory hub positioned in approximately a center of the circuit board;
 a plurality of memory devices positioned around the memory hub and arranged in pairs, each memory device including pins associated with a first functional group of signals adjacent a first end of the device and pins associated with a second functional group of signals adjacent a second end of the device, and the first ends of the devices in each pair being positioned adjacent one another on the circuit board and the second end of each device in a pair being positioned adjacent a second end of a device in one of the other pairs;
 a bus electrically coupled to the memory hub, wherein at least a portion of the bus is formed at an angle relative to the edge of the circuit board; and
 an edge connector positioned along an edge of the circuit board and coupled to the memory hub.

2. The memory module of claim 1 where the electrical contacts are pins.

3. The memory module of claim 1 wherein the memory devices of the pairs are arranged orthogonally relative to one another.

4. The memory module of claim 1 wherein the memory devices of the pairs are arranged parallel relative to one another.

5. The memory module of claim 1 wherein the pairs of memory devices are positioned orthogonally relative to the other pairs of memory devices.

6. The memory module of claim 1 wherein each memory device of a pair is oriented 180 degrees relative to the other memory device.

7. The memory module of claim 1 wherein each of the plurality of memory devices comprises a wide data memory device.

8. The memory module of claim 1 wherein each the plurality of memory devices comprises a low-width memory device.

9. The multi-chip memory module of claim 1 wherein the circuit board comprises a first side and a second side opposite of the first side, and memory devices are located on both the first and second sides of the circuit board.

10. The multi-chip memory module of claim 1 wherein the circuit board comprises a first edge and a first edge connector formed at the first edge.

11. The multi-chip memory module of claim 10 wherein the circuit board further comprises a second edge opposite the first edge, the circuit board further including a second edge connector formed at the second edge.

12. The multi-chip memory module of claim 1 wherein the memory hub is position substantially at a middle of the circuit board.

13. The multi-chip memory module of claim 1 wherein the circuit board comprises busses electrically coupled to the memory hub, the busses formed on the circuit board routed through a region covered by a memory device.

14. A multi-chip memory module comprising:
 a memory hub;
 a plurality of memory devices positioned around the memory hub, arranged in pairs, and coupled to the memory hub, each respective one of the memory devices including electrical contacts associated with a first functional group of signals adjacent a first end of the respective memory device and electrical contacts associated with a second functional group of signals adjacent a second end of the respective memory device, and the first end of each memory device in each pair being positioned adjacent one another; and
 first busses coupled to the electrical contacts associated with the first functional group of signals of the plurality of memory devices and further comprising second busses coupled to the electrical contacts associated with the second functional group of signals of the plurality of memory devices, the first busses coupled to memory devices of two different pairs and each of the second busses coupled to a respective one of the plurality of memory devices.

15. The multi-chip memory module of claim 14 wherein first and second busses are oriented at an angle relative to one another.

16. The multi-chip memory module of claim 14 wherein the electrical contacts associated with the first functional group of signals comprises electrical contacts configured to receive command and address signals.

17. The multi-chip memory module of claim 14 wherein the electrical contacts associated with the second functional group of signals comprises electrical contacts configured to receive data signals.

* * * * *

UNITED STATES PATENT AND TRADEMARK OFFICE
CERTIFICATE OF CORRECTION

PATENT NO. : 8,438,329 B2
APPLICATION NO. : 12/986947
DATED : May 7, 2013
INVENTOR(S) : Jeffery W. Janzen It is certified that error appears in the above-identified patent and that said Letters Patent is hereby corrected as shown below:

In the Claims:

In column 10, line 10, in Claim 8, delete "each" and insert -- each of --, therefor.

Signed and Sealed this
Sixteenth Day of July, 2013

Teresa Stanek Rea
*Acting Director of the United States Patent and Trademark Office*